United States Patent [19]

Kennedy et al.

[11] Patent Number: 4,975,953
[45] Date of Patent: Dec. 4, 1990

[54] COMBINED DEEMPHASIS CIRCUIT AND NOISE BLANKER

[75] Inventors: Richard A. Kennedy, Russiaville; Gregory J. Manlove, Kokomo; Jeffrey J. Marrah, Kokomo; Seyed R. Zarabadi, Kokomo, all of Ind.

[73] Assignee: Delco Electronics Corporation, Kokomo, Ind.

[21] Appl. No.: 296,563

[22] Filed: Jan. 13, 1989

[51] Int. Cl.$^5$ .............................................. H04H 5/00
[52] U.S. Cl. ...................................................... 381/13
[58] Field of Search ................. 381/13, 10, 11, 2, 3, 381/4

[56] References Cited

U.S. PATENT DOCUMENTS 4,087,756 5/1978 Rogers, Jr. ........................... 455/208
4,574,390 3/1986 Hirohashi et al. ..................... 381/13
4,680,793 7/1987 Sugai et al. ............................ 381/13

Primary Examiner—Forester W. Isen
Attorney, Agent, or Firm—Albert F. Duke

[57] ABSTRACT

An FM stereo radio circuit has an ultrasonic noise detector and an amplitude noise detector each for detecting impulse noise by developing an average noise signal and comparing the average noise signal with an attenuated value of the instantaneous noise signal to generate a noise flag. A dual mode circuit normally operates as a low pass filter for a deemphasis function and is switched by the noise flag to operate as a sample and hold circuit which blanks the noise pulse. The dual mode circuit uses a switched capacitance design and is driven by clock signals to serve as a filter. The clock signals are stopped by the noise flag to effect the sample and hold function.

4 Claims, 5 Drawing Sheets

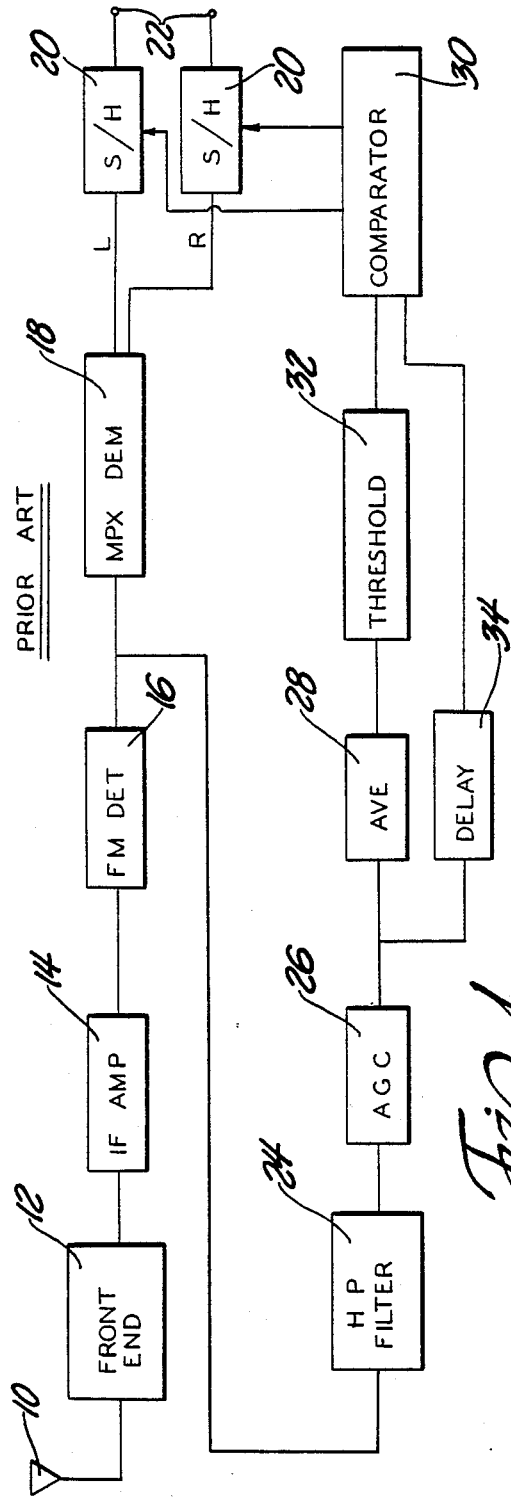
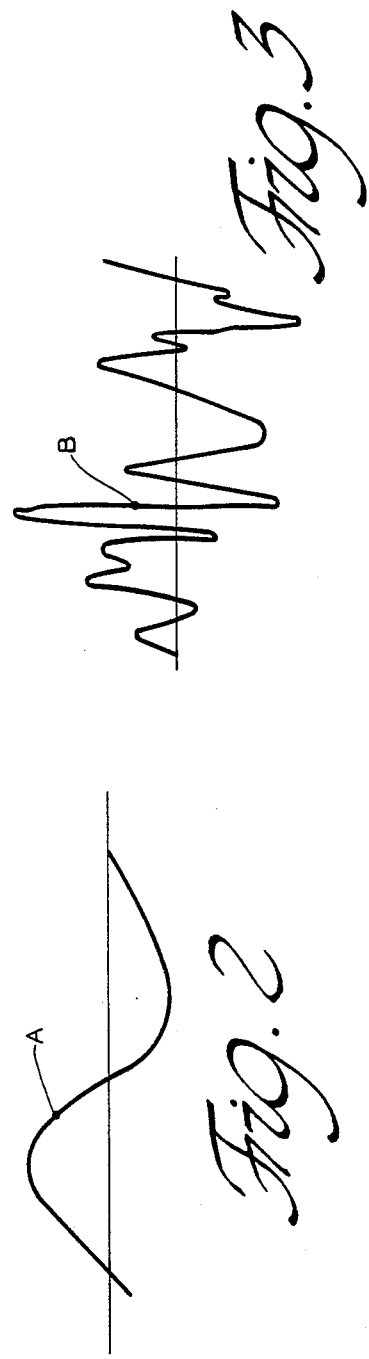

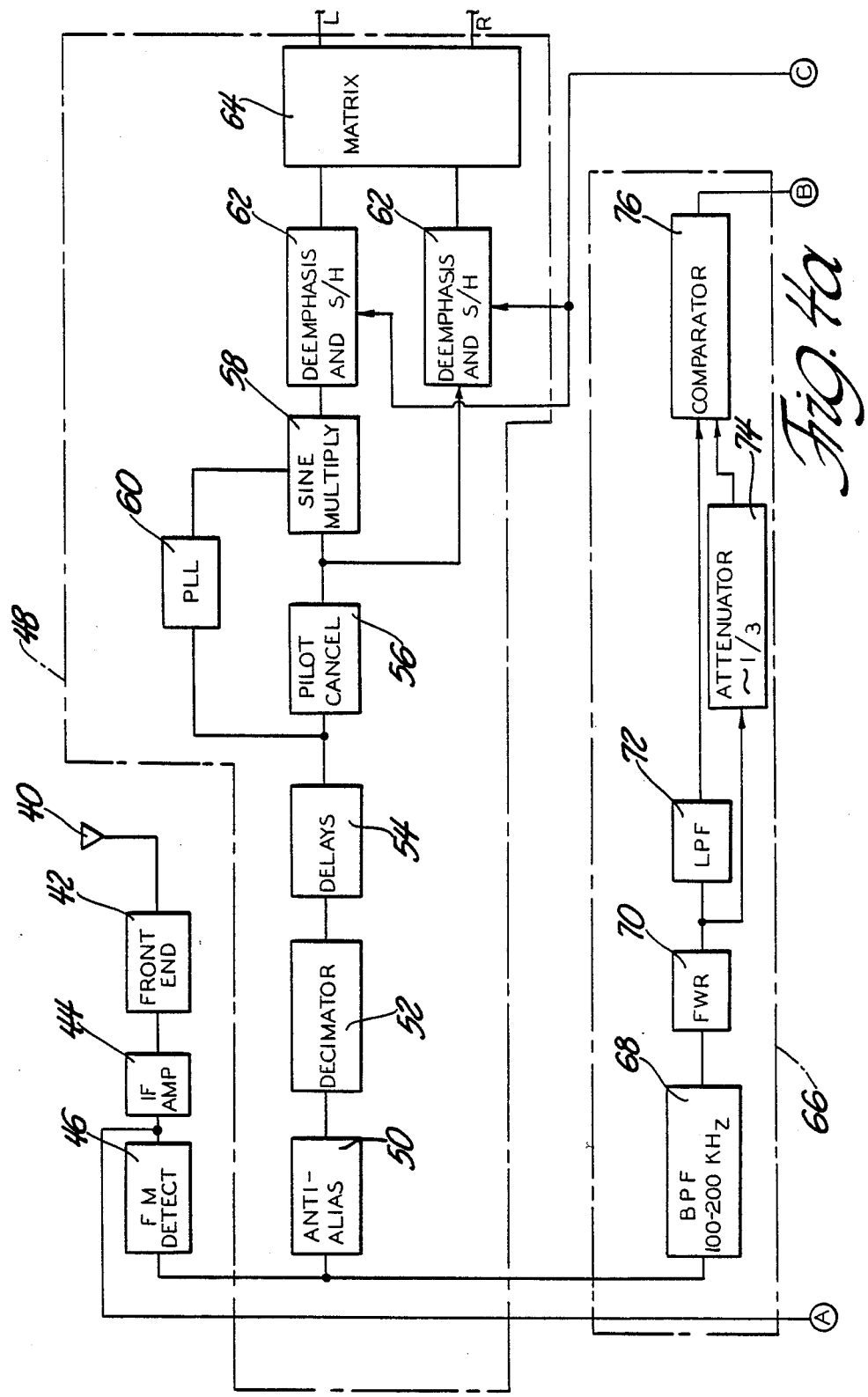

COMBINED DEEMPHASIS CIRCUIT AND NOISE BLANKER

FIELD OF THE INVENTION

This invention relates to a noise blanker for an FM radio circuit and particularly to a deemphasis circuit combined with a noise blanker for a short duration impulse noise.

BACKGROUND OF THE INVENTION

It is desirable to eliminate noise from FM radio signals to avoid distracting sounds in the audio broadcast. Automotive radios are particularly susceptible to noises because of their proximity to the engine ignition system which generously emanates radio signals. The spark of the ignition system often creates a very short duration impulse or spike known as a tic which is very disconcerting to the audio listener. It is already known to eliminate the tic by detecting its occurrence and blanking the noise by preventing radio signal passage to the speakers for the duration of the tic which is generally much shorter than 60 microseconds. Because this particular type of noise has such a short duration the interruption of the signal is not noticeable if that period is filled with an approximation of the correct signal. There are two critical aspects of such noise blanking: correctly and efficiently detecting the impulse noise and removing the noise in the optimal manner.

An example of a prior attempt to blank short duration pulses is shown in the U.S. Pat. No. 4,293,736 to Ogita which is conceptually like FIG. 1 herein. An input signal received at an antenna 10 is converted into an IF signal in a front end circuit 12 and is amplified in the IF amplifier 14. The signal is FM detected at detector 16 to generate an FM composite signal and a multiplex stereo demodulator 18 produces right and left channels which are fed through sample and hold circuits 20 to the receiver output terminals 22. To detect noise pulses a high pass filter 24 passes the ultrasonic portion of the FM composite signal to an automatic gain control circuit 26 and the resultant signal is averaged at an averaging circuit 28 and forwarded to a comparator 30 via a threshold 32. The non-averaged signal is fed to the comparator 30 via a delay 34. Thus a pulsating noise signal is compared to the average noise plus a fixed offset and produces a comparator output when the noise spike is high enough to exceed the threshold. That output triggers the sample and hold circuits 20 causing them to block any ensuing signal for the duration of the comparator output and instead holds the signal that was present when the spike was detected.

Problems arise with both the noise detection and the noise blanking aspects of Ogita. First, the high pass filter allows all high frequency signals including the signal of an adjacent channel to be considered as noise thereby giving rise to false noise signals. Second, the fixed offset or threshold makes the noise detector sensitive to any offset generated in prior stages in the circuit. Third, the AGC 26, which is required when the fixed offset is used, is a complex addition to the circuit and introduces a time constant to the circuit. Fourth, the sample and hold circuit 20 is placed after the demodulator 18. Since the demodulator contains a low pass filter to serve as a deemphasis circuit and to remove unwanted high frequencies from the audio signal, any noise pulse becomes stretched in the filter so that the signal must be blanked for a longer time to remove the noise. This obviously increases the difficulty of noise removal without audible disturbance.

Another common error in noise blanking is the attempted removal of the noise prior to the deemphasis circuit. This is illustrated in the U.S. Pat. No. 4,574,390 to Hirohashi et al. which shows a noise reduction circuit just after a separation circuit and before the deemphasis circuit. A sample and hold of the signal present when the noise occurs is effected there. It should be recognized, however, that under certain conditions there is little or no correlation between the audio signal and the instantaneous value of the wide bandwidth composite signal. At that point, the signal has much high amplitude, high frequency content superimposed on the audio signal. FIG. 2 shows an ideal audio signal as eventually output to the speakers. FIG. 3 shows the same signal before the deemphasis circuit filters of high frequency components. If the unfiltered signal is sampled at any point, there is a danger of sampling a high frequency component which is very different from the base band signal thus causing a noise rather than reducing noise. For example, the point desired to be sampled in the audio signal may be at point A of FIG. 2 but the actual point in the unfiltered signal may be point B of FIG. 3. To make matters worse, Hirohashi et al propose to alter the sampled signal according to the slope of the signal at the time of the noise signal. The high frequency content introduces very steep slopes not correlated with the base band signal slopes. Thus the sampled signal can be very wrong initially and then get much worse during the hold period. Complicated circuit are proposed in the patent to try to compensate for these additional problems.

SUMMARY OF THE INVENTION

It is therefore an object of the invention to provide a noise reduction circuit to an FM radio for eliminating short duration impulse noises. One aspect of this object is to efficiently detect such noise without negative impact on the circuit, and another aspect is to make the noise reduction in a deemphasis circuit with no significant addition to the circuit.

The invention is carried out in an FM stereo radio circuit by a combined noise blanker and deemphasis circuit comprising, a flag generating circuit responsive to the FM composite signal for detecting a short duration noise pulse and generating a flag for the duration of the noise, demodulator means for producing a stereo demodulated signal, a dual mode circuit coupled to the demodulator means to receive the demodulated signal and effective to operate in a first mode as a low pass filter and in a second mode as a sample and hold circuit, and control means coupled to the flag generating circuit for normally operating the dual mode circuit as a low pass filter to serve as a deemphasis circuit and responsive to a flag for switching to the second mode to sample the filtered signal that was present at the moment of switching and hold the sampled signal for the duration of the flag so that the noise pulse does not pass through the dual mode circuit.

BRIEF DESCRIPTION OF THE DRAWINGS

The above and other advantages of the invention will become more apparent from the following description taken in conjunction with the accompanying drawings wherein like references refer to like parts and wherein:

FIG. 1 is a block diagram of a prior art FM noise reduction circuit,

FIG. 2 is a wave form of a sample base band audio signal,

FIG. 3 is a wave form of a sample audio signal before low pass filtering takes place, FIGS. 4a and 4b are block diagrams of an FM radio receiver with particular attention to the stereo demodulator and noise reduction circuitry.

DESCRIPTION OF THE PREFERRED EMBODIMENT

Figure 4B:
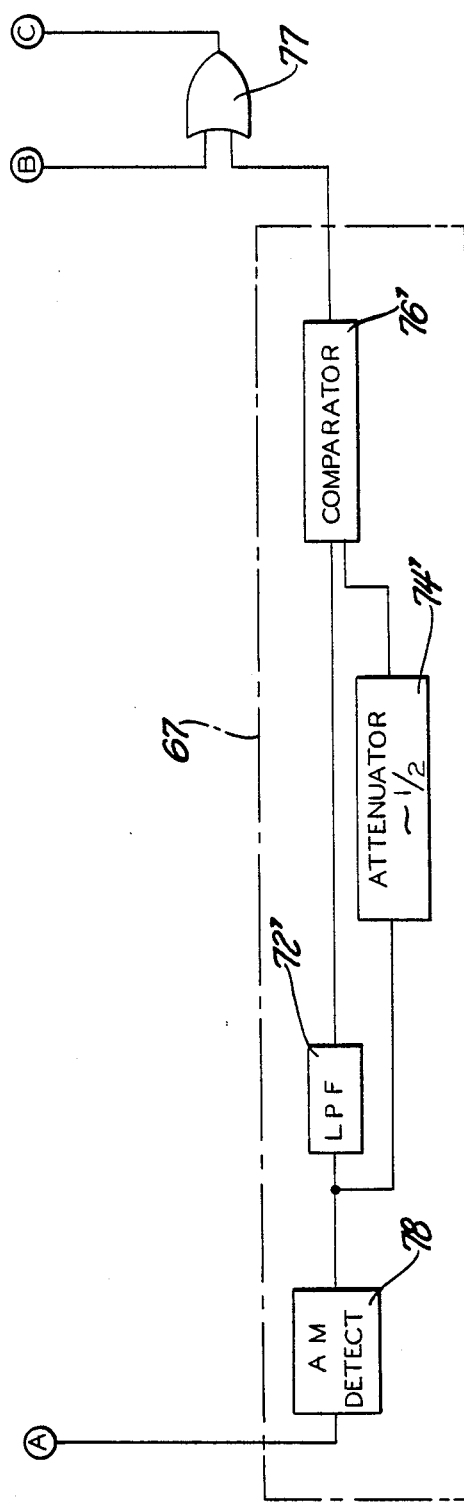
Figure 5A:
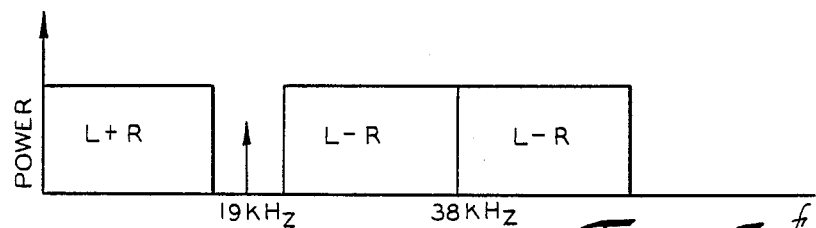
FIGS. 5a, 5b, 5c, 5d, and 5e are signal power spectra which illustrate the signal processing of the stereo demodulator of FIG. 4.
Figure 5B:
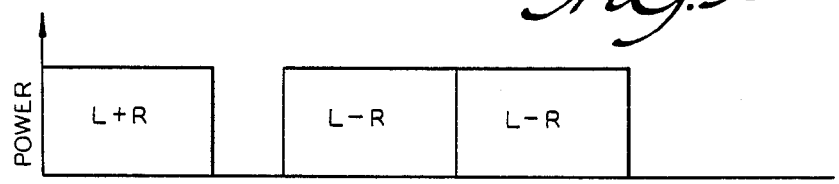
Figure 5C:
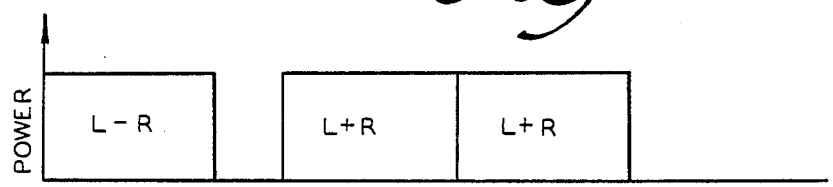
Figure 5D:
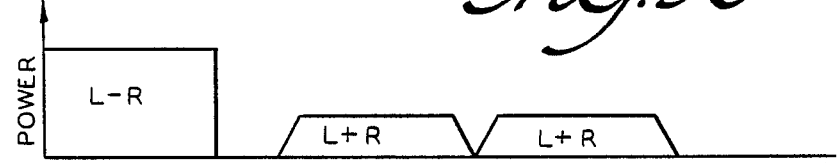
Figure 5E:
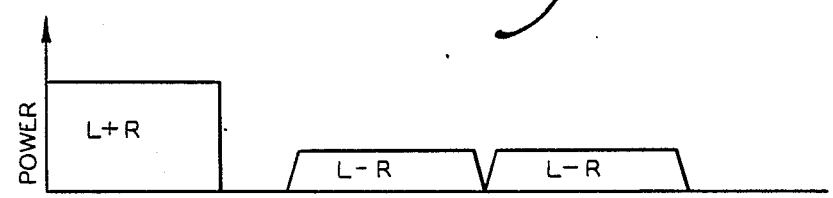

Referring to FIGS. 4a and 4b, an input signal received at an antenna 40 is converted into an IF signal in a front end circuit 42 and is amplified in the IF amplifier 44. The signal is FM detected at detector 46 to generate an FM composite signal which is fed to a multiplex stereo demodulator 48. The first stage of the demodulator 48 is an antialiasing filter 50 followed by a decimator circuit 52 and a delay circuit 54. The circuits 50 and 52 filter much high frequency content from the composite signal. The delay circuit 54 allows time for the noise detection circuit, to be described, to decide whether an impulse noise is present and to generate a noise flag coincident with the audio signal following the delay. A pilot cancelling circuit 56 removes the 19 kHz pilot signal from the composite signal which is then multiplied in a multiplier 58 by a 38 kHz sine wave. A phase locked loop 60 coupled between the delay circuit 54 output and the multiplier 58 assures the proper phase match of the sine wave and the 19 kHz pilot. Then the two signals taken from the multiplier input and from the multiplier output are separately fed through deemphasis and sample and hold circuits 62 and then finally to the matrix 64 which yields left and right channel audio signals. As thus far described, the FM circuit is rather conventional except for the combined deemphasis and sample and hold circuit.

FIG. 5 is a series of signal power spectra which illustrate the signal processing of the several stages just described. In FIG. 5a the signal comprises a base band signal comprising the left and right channel added together (L+R), a 19 kHz pilot, and a difference of the left and right channel signals L−R in a subchannel centered around a 38 kHz pilot. FIG. 5b shows the same spectra with the 19 kHz pilot removed by the cancelling circuit 56. FIG. 5c shows the result of multiplying the FIG. 5b signal by the 38 kHz sine wave: the base band contains the L−R information and the subchannel has the L+R information. The effect of the low pass filter in the deemphasis circuit on the FIGS. 5b and 5c signals is revealed in FIGS. 5d and 5e. The subchannel is suppressed, although not entirely eliminated. Finally, the matrix circuit separates the right and left channels in the base band.

A noise detector comprises an ultrasonic noise detector 66 and a signal strength detector 67. The ultrasonic noise detector 66 comprises a 100 kHz to 200 kHz band pass filter 68 connected to the FM composite signal output of the FM detector circuit 46, a full wave rectifier circuit 70, and a low pass filter 72 in series. An output of the rectifier connects to an attenuator circuit 74 which attenuates that output by a factor of, say, three. Then the filtered signal and the attenuated signal form the inputs of a comparator 76 which produces a noise flag when the attenuated signal exceeds the filtered signal. The noise flag is coupled through an OR gate 77 and input to each deemphasis and sample and hold circuit 62. In operation of the noise detector, the band pass filter 68 passes the ultrasonic noise from the composite signal which is then rectified. The low pass filter 72 averages the rectified signal and presents the average to the comparator 76. The pulsating or nonaveraged signal is attenuated and compared to the average. The comparator generates an output or flag when the attenuated noise spike rises above the average. If the noise is not of short duration the average will soon increase so the difference will decrease and the flag will disappear. By attenuating the pulsating signal and comparing with the average, a floating offset is built in and no fixed offset and AGC circuit are needed. The comparator will turn on to generate the flag signal when the unfiltered noise signal reaches three times the average signal amplitude. In another implementation of the circuit, the attenuator circuit 74 is omitted and the pulsating signal is fed directly to the comparator. The gain of the average signal is increased in the filter 72 or in the comparator, or the pulsating signal is attenuated in the comparator.

The signal strength noise detector 67 is similar to the ultrasonic noise detector 66 and includes a low pass filter 72′, an attenuator 74′ and a comparator 76′ arranged and functioning in the same manner as the corresponding elements 72, 74 and 76 in the circuit 66, although an attenuation by a factor of about 2 is preferred in circuit 74′. Since the purpose of the signal strength detector 67 is to detect a change in signal amplitude in the IF signal, an AM detector 78 in the input of the signal strength detector 67 is connected to the output of the IF amplifier to provide an amplitude signal to the filter 72′ and the attenuator 74′. The output of the comparator 76′ is coupled through the OR gate 77 to the inputs of the deemphasis and S/H circuits 62. Each flag (from circuits 66 and 67) is more sensitive than the other under different operating conditions so that the two flags in combination provide a valid indication of tic over a wide variety of signal conditions.

Figure 6:
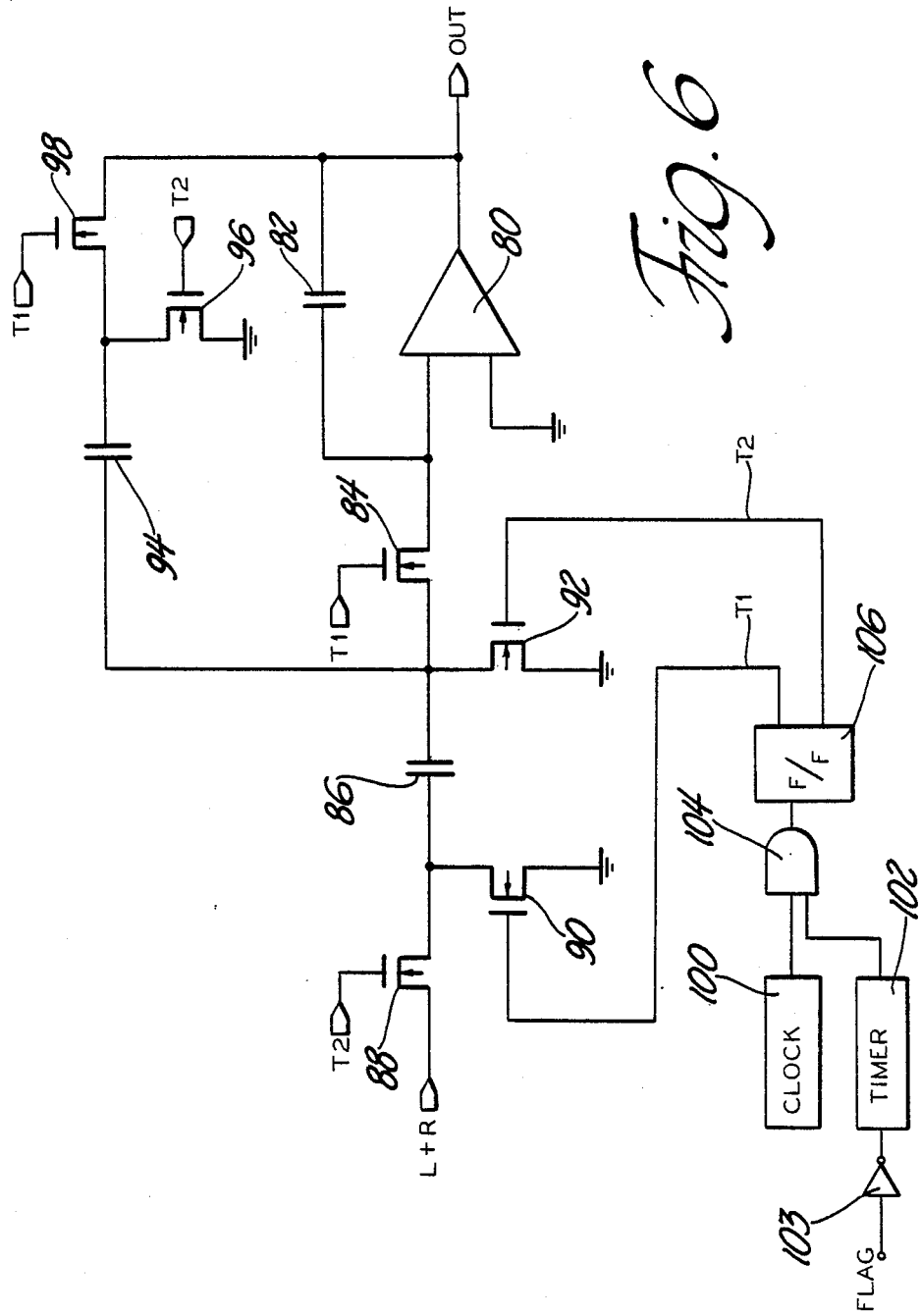
FIG. 6 is a schematic circuit of a dual mode circuit for the deemphasis and sample and hold functions of the circuit of FIG. 4.

FIG. 6 is a schematic circuit of the dual mode circuit for the deemphasis and sample and hold functions. The circuit is implemented in CMOS using switched capacitance circuitry. As is well known, the switched capacitance design simulates a resistor by a capacitor circuit which is rapidly switched to transfer as much current as would an equivalent resistor. An operational amplifier 80 has a feedback capacitor 82 between its output and its negative input terminal. The positive input terminal is grounded. The negative input terminal is coupled through a transistor 84 to a capacitor 86 which in turn is connected by a transistor 88 to the deemphasis circuit input. The input side of capacitor 84 is coupled to ground through a transistor 90 and its other side is coupled to ground through a transistor 92 and is also coupled to one side of a capacitor 94. The other side of capacitor 94 is connected to ground through a transistor 96 and to the operational amplifier output through a transistor 98. A system clock 100 and a timer 102 are connected to inputs of an AND circuit 104. The flag signal generated in the noise detector is coupled to an inverter 103 input which in turn is connected to the timer 102 input. The timer is arranged to pass the leading edge of the flag signal without delay and to effectively continue its output for a set time, say 26 microseconds, beyond the trailing edge of the flag signal, thus generating an extended flag signal. Depending on the particular form of the flag generation circuitry, the flag length may be satisfactory without extension so that the timer 102 may be omitted or set at a low value. The AND gate 104 passes the clock signal when the extended flag signal is not present and stops the clock signal when the extended signal appears. The AND gate output is connected to the input of a flip-flop circuit 106 which produces two clock signals, T1 and T2, which are out of phase and non-overlapping. The clock signal T1 is coupled to the gates of transistors 84, 90, and 98 and the signal T2 is connected to the gates of transistors 82, 88 and 96. As is well known, transmission gates are generally preferred over transistors for the capacitance switching applications but the transistors shown here are conceptually equivalent.

In operation, the dual mode circuit is a first order low pass filter when the clock signals are running. Such a low pass filter operation is well known and need not be explained here. The same circuit becomes a sample and hold circuit when the clock signals are stopped at the presence of the flag. At that moment the filtering action is suspended until the extended flag is removed and the clocks start running again. Either the signal T1 or T2 may be on during the hold period. The composite input signal carrying the 38 kHz subchannel signals (as shown in FIG. 3) is effectively filtered while the clock signals T1 and T2 are running to greatly reduce those high frequency components and yield a relatively simple audio signal (as shown in FIG. 2). When the clock signals are stopped the instantaneous filtered signal is held for the duration of the extended flag. Thus the dual mode circuit provides the ideal place for noise reduction. Any position after the filter causes pulse stretching of the noise signal so that a long blanking period is required and any position before the filter contains the high frequency signals which can yield an unacceptable hold signal. In this circuit the sample and hold is used in place of the filter when the flag is on and thus is neither after nor before the filter. Pulse stretching of the short duration pulse is avoided and holding on a noisy signal is avoided. These advantages are realized by adding to the deemphasis circuit only the inverter 104 and the AND gate 106. Thus a separate sample and hold circuit is not necessary.

As shown, the sample and hold will last just as long as the extended noise flag, and the noise flag duration is kept to a minimum value by the noise detection circuit 66, 67. The noise detection circuit is preferably designed with time constants which allow a maximum flag period of about 26 microseconds. It may be desirable to extend the hold period beyond the flag period to be sure of blanking the entire noise spike. Thus, an extension of 26 microseconds via the timer 102 is practical. Even with the extension the total hold period will be less than 60 microseconds and will not be noticeable to the listener.

The embodiments of the invention in which an exclusive property or privilege is claimed are defined as follows:

1. In an FM stereo radio circuit, a combined noise blanker and deemphasis circuit comprising,
    a flag generating circuit responsive to the FM composite signal for detecting a short duration noise pulse and generating a flag for the duration of the noise,
    demodulator means for producing a stereo demodulated signal,
    clock means for producing clock signals,
    a dual mode circuit coupled to the demodulator means to receive the demodulated signal, the dual mode circuit comprising a switched capacitance low pass filter driven by clock signals in a first mode and effective to act as a sample and hold circuit when the clock signals are stopped in a second mode,
    clock signal control means coupled to the flag generating circuit for normally passing the clock signals to the dual mode circuit in the first mode to operate the dual mode circuit as a low pass filter to serve as a deemphasis circuit, and responsive to a flag for switching to the second mode to sample the filtered signal that was present at the moment of switching and hold the sampled signal at least for the duration of the flag so that the noise pulse does not pass through the dual mode circuit.

2. In an FM stereo radio circuit, a combined noise blanker and deemphasis circuit comprising,
    a flag generating circuit responsive to the FM composite signal for detecting a short duration noise pulse and generating a flag for the duration of the noise, the flag generating circuit comprising a band pass filter receiving the FM composite signal for passing 100 kHz to 200 kHz, a full wave rectifier following the band pass filter, a low pass filter for averaging the rectified signal, means for attenuating the rectified signal by a determined factor, and a comparator responsive to the averaged signal and the attenuated signal such that a flag is produced by the comparator when the rectified signal exceeds a preset multiple of the averaged signal,
    demodulator means for producing a stereo demodulated signal,
    clock means for producing clock signals,
    a dual mode circuit coupled to the demodulator means to receive the demodulated signal, the dual mode circuit comprising a switched capacitance low pass filter driven by clock signals in a first mode and effective to act as a sample and hold circuit when the clock signals are stopped in a second mode,
    clock signal control means coupled to the flag generating circuit for normally passing the clock signals to the dual mode circuit in the first mode to operate the dual mode circuit as a low pass filter to serve as a deemphasis circuit, and responsive to a flag for switching to the second mode to sample the filtered signal that was present at the moment of switching and hold the sampled signal for the duration of the flag so that the noise pulse does not pass through the dual mode circuit.

3. In an FM stereo radio circuit, a combined noise blanker and deemphasis circuit comprising,
    a flag generating circuit for detecting short duration noise spikes comprising a band pass filter receiving the FM composite signal for passing 100 kHz to 200 kHz, a full wave rectifier following the band pass filter, a low pass filter for averaging the rectified signal, means for relatively adjusting the gain of the averaged signal to be more than the gain of the rectified signal and a comparator responsive to the outputs of the rectified and the low pass filter such that a flag is produced by the comparator when the rectified signal exceeds a preset multiple of the averaged signal, demodulator means for receiving the FM composite signal and producing a stereo demodulated signal, a dual mode deemphasis circuit responsive to the flag and coupled to the demodulator means to receive the demodulated signal and effective in the absence of the flag to normally operate in a first mode as a low pass filter and in a second mode in the presence of the flag as a sample and hold circuit to thereby blank out noise occurring during the flag duration.

4. The invention as defined in claim 3 wherein the flag generating circuit further comprises an AM detector receiving the IF signal to produce an amplitude signal, a second low pass filter for averaging the amplitude signal, means for relatively adjusting the gain of the averaged signal to be more than the gain of the amplitude signal and a second comparator responsive to the outputs of the AM detector and the second filter such that a second flag is produced by the second comparator when the amplitude signal exceeds a preset multiple of the averaged signal.

* * * * *